(12) United States Patent
Lu et al.

(10) Patent No.: US 10,869,553 B2
(45) Date of Patent: Dec. 22, 2020

(54) SUPPORTING APPARATUS OF A SERVER CABINET AND SERVER CABINET USING THE SAME

(71) Applicant: HONGFUJIN PRECISION ELECTRONICS (TIANJIN) CO., LTD., Tianjin (CN)

(72) Inventors: Hsueh-Chin Lu, New Taipei (TW); Ti-An Tsai, New Taipei (TW); Hung-Liang Chung, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/166,146

(22) Filed: Oct. 21, 2018

(65) Prior Publication Data

US 2020/0054137 A1 Feb. 20, 2020

(30) Foreign Application Priority Data

Aug. 16, 2018 (CN) .......................... 2018 1 0937599

(51) Int. Cl.
*A47B 97/00* (2006.01)
*H05K 7/18* (2006.01)

(52) U.S. Cl.
CPC ............... *A47B 97/00* (2013.01); *H05K 7/18* (2013.01); *A47B 2097/008* (2013.01)

(58) Field of Classification Search
CPC .... A47B 2097/008; A47B 97/00; H05K 7/18; H05K 7/1488; H05K 5/0234; B60B 33/063
See application file for complete search history.

(56) References Cited

U.S. PATENT DOCUMENTS

| 4,372,632 A * | 2/1983 | Villa | E05B 65/463 |
| | | | 312/107.5 |
| 4,836,624 A * | 6/1989 | Schwickrath | A47B 97/00 |
| | | | 211/4 |
| 4,998,828 A * | 3/1991 | Hobbs | A47B 88/493 |
| | | | 312/334.46 |
| 6,082,845 A * | 7/2000 | Eizadkhah | H05K 7/16 |
| | | | 312/223.1 |
| 6,857,711 B1 * | 2/2005 | Straus | A47B 45/00 |
| | | | 312/205 |

(Continued)

FOREIGN PATENT DOCUMENTS

CN 101553097 10/2009

*Primary Examiner* — Daniel J Troy
*Assistant Examiner* — Ryan A Doyle
(74) *Attorney, Agent, or Firm* — ScienBiziP, P.C.

(57) ABSTRACT

An inbuilt but deployable supporting apparatus for supporting a server cabinet includes an extension arm and a supporting unit. The extension arm includes two opposite ends, one end of the extension arm is movably connected to a lower side of the server rack, the supporting unit is connected to the other end of the extension arm. The extension arm is movable between a retracted position, where the extension arm saves space by being accommodated in the lower side of the server rack, and a deployed position, where the extension arm is extended out of the server rack and, being adjustable in respect of the distance or depth down to a supporting surface, takes support from the supporting surface through the supporting unit.

18 Claims, 6 Drawing Sheets

(56) References Cited

U.S. PATENT DOCUMENTS

| | | | | |
|---|---|---|---|---|
| 7,374,186 B2* | 5/2008 | Mason | ............ | A47F 3/0482 |
| | | | | 280/47.131 |
| 2004/0174105 A1* | 9/2004 | Hung | ............ | A47B 91/02 |
| | | | | 312/351.1 |
| 2009/0251038 A1* | 10/2009 | Yu | ............ | A47B 97/00 |
| | | | | 312/351.1 |
| 2011/0115354 A1* | 5/2011 | Blochl | ............ | A47B 91/02 |
| | | | | 312/351.1 |
| 2013/0278124 A1* | 10/2013 | Hu | ............ | A47B 96/025 |
| | | | | 312/333 |
| 2014/0008313 A1* | 1/2014 | Chen | ............ | H05K 7/18 |
| | | | | 211/26 |
| 2014/0076829 A1* | 3/2014 | Fan | ............ | H05K 7/1488 |
| | | | | 211/26 |
| 2017/0034935 A1* | 2/2017 | Anderson | ............ | H05K 5/0234 |

* cited by examiner

SUPPORTING APPARATUS OF A SERVER CABINET AND SERVER CABINET USING THE SAME

FIELD

The subject matter herein generally relates to supporting structures for electronic devices.

BACKGROUND

A server cabinet is used to accommodate a plurality of server units. When server units are installed or uninstalled from the server cabinet, the center of gravity of the server cabinet may be changed, which may cause tilting or instability of the cabinet. A supporting apparatus can be used to prevent the server cabinet from tilting, but the supporting apparatus occupies extra space.

Thus, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
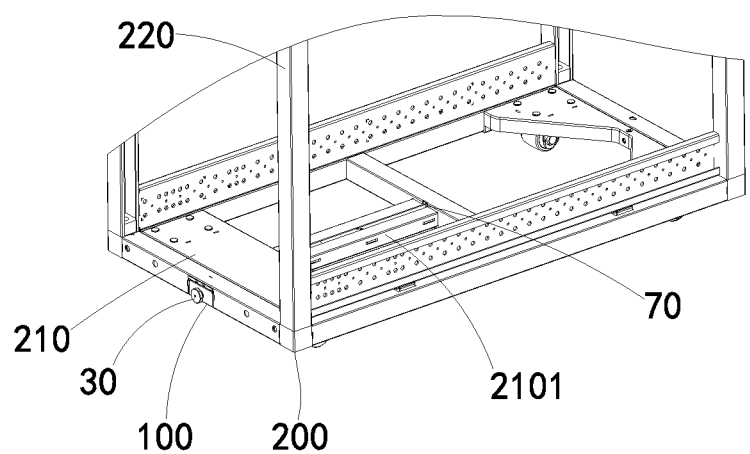
FIG. 1 shows an isometric view of a server cabinet, showing a supporting apparatus in a retracted position.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

FIGS. 1 to 4 show a server cabinet 500. The server cabinet 500 includes a server rack 200 and a supporting apparatus 100.

The supporting apparatus 100 supports the server rack 200. For example, the server rack 200 can be used to accommodate a plurality of server units (not shown), when the server units are being installed or removed, a center of gravity of the server cabinet 500 can change. The supporting apparatus 100 prevents tilting or instability of the server rack 200.

Figure 4:
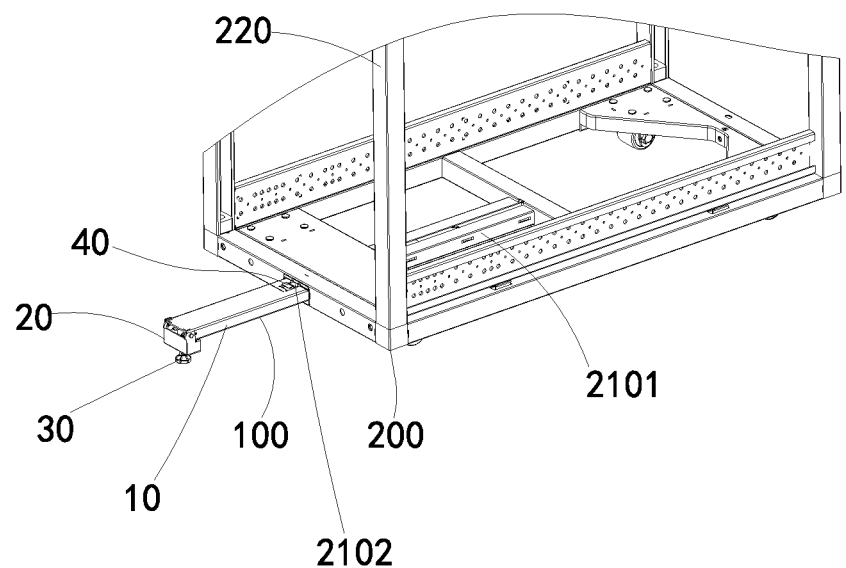
FIG. 4 shows another isometric view of the server cabinet of FIG. 1, showing the server rack in a deployed position, and showing the adjusting unit in a second position.
Figure 5:
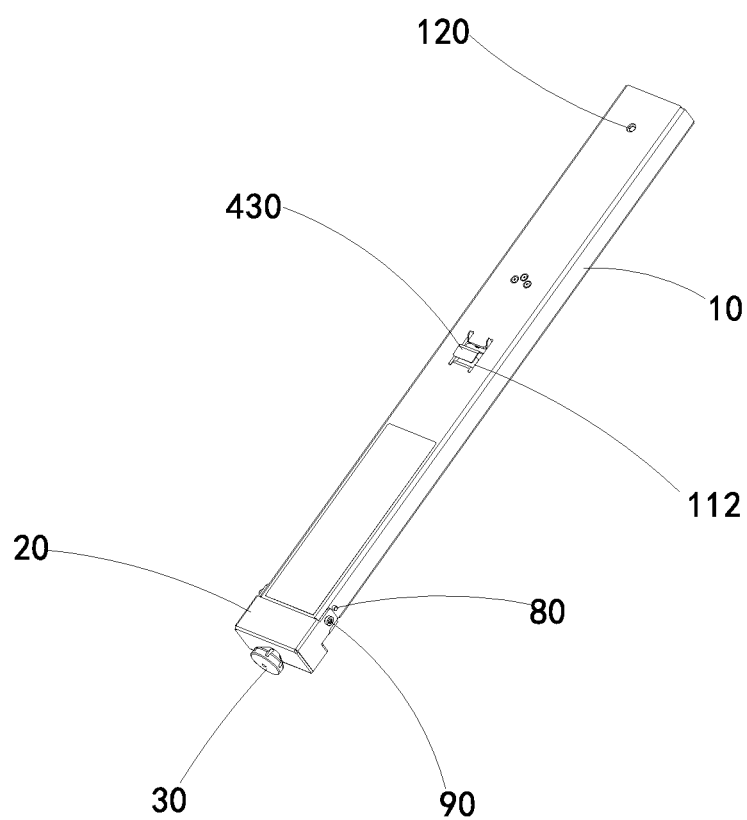
FIG. 5 shows a isometric view of the supporting apparatus of the server cabinet of FIG. 1.
Figure 6:
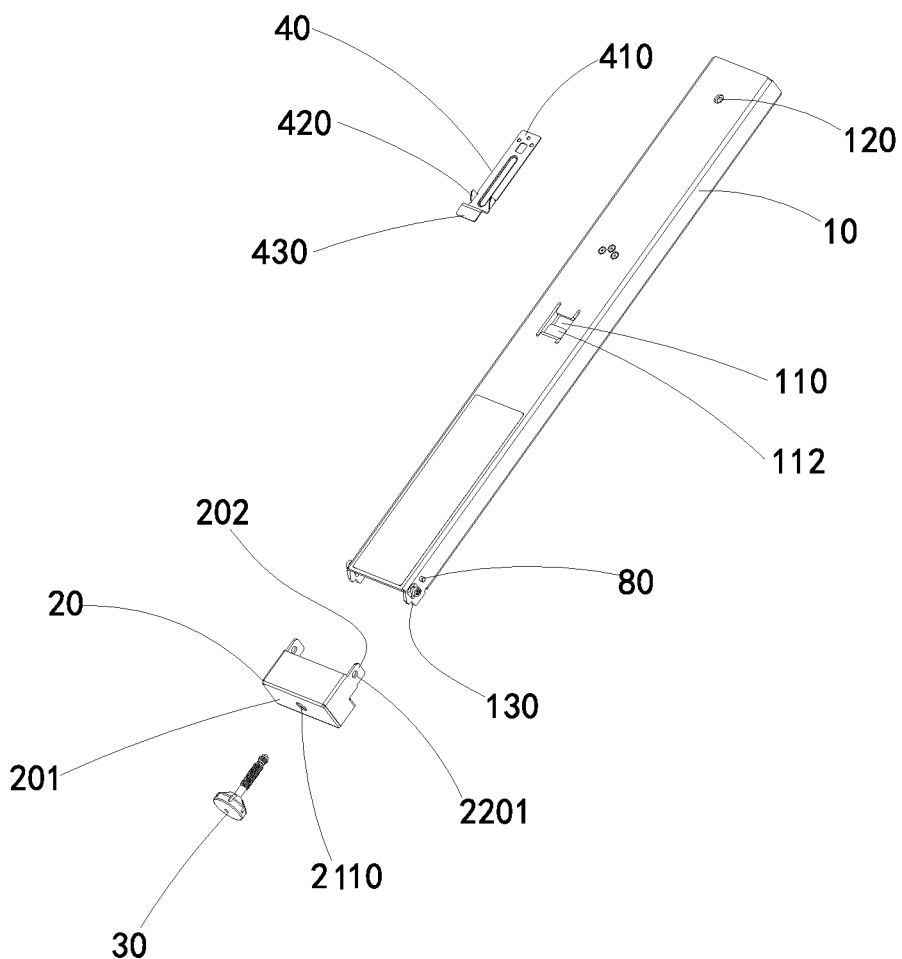
FIG. 6 shows an exploded view of an embodiment of the supporting apparatus of FIG. 5.

FIGS. 4-6 show the supporting apparatus 100 can include an extension arm 10 and a supporting unit 20.

The extension arm 10 includes two opposite ends. One end of the extension arm 10 is movably connected to a lower side of the server rack 200. The supporting unit 20 is connected to the other end of the extension arm 10.

Figure 2:
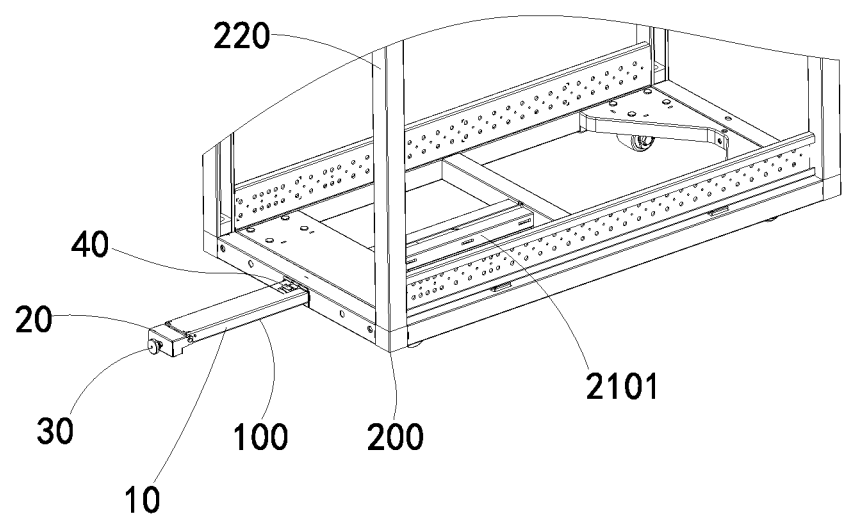
FIG. 2 shows another isometric view of the server cabinet of FIG. 1, showing the supporting apparatus in an deployed position.
Figure 3:
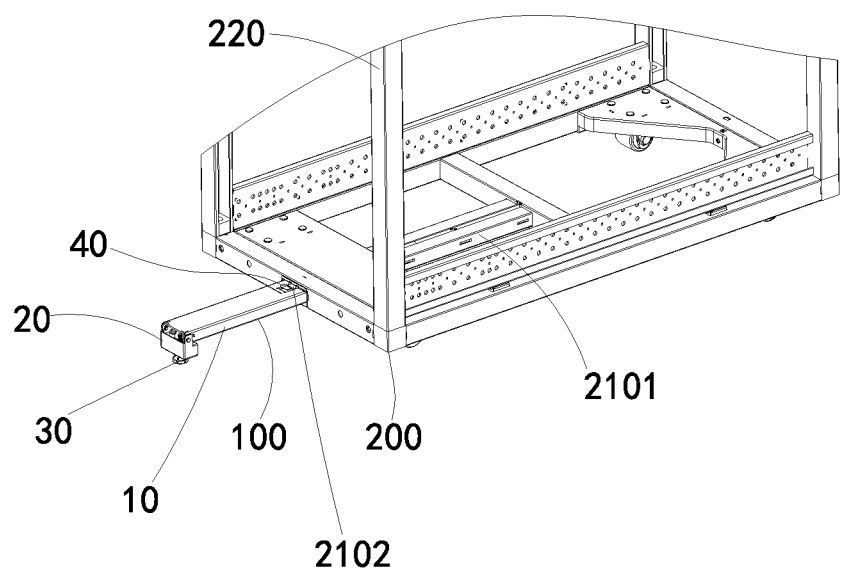
FIG. 3 shows another isometric view of the server cabinet of FIG. 1, showing a server rack in a deployed position, and showing an adjusting unit in a first position.

The extension arm 10 is movable between a retracted position (as shown in FIG. 1) and a deployed position (as shown in FIGS. 2-4).

When the extension arm 10 is moved to the retracted position, the extension arm 10 is accommodated in a lower side of the server rack 200. When the extension arm 10 is moved to the deployed position, the extension arm 10 extends out of the server rack 200 and contacts a supporting surface through the supporting unit 20. The supporting surface can be the floor on which the server cabinet 500 is placed.

For example, the server rack 200 can include a bottom plate 210 and a plurality of side plates 220 connected to an upper side of the bottom plate 210. The bottom plate 210 defines a receiving space 2101.

When the server rack 200 is empty or not being used, the extension arm 10 can be received in the receiving space 2101. When the server rack 200 is occupied, the extension arm 10 can be extended out of the receiving space 2101 to the deployed position to support the server rack 200.

The supporting unit 20 can be rotationally connected to the end of the extension arm 10, and the supporting unit 20 can rotate relative to the end of the extension arm 10 to adjust a distance between the extension arm 10 and the supporting surface.

For example, the supporting unit 20 can include a supporting member 201 and a rotating arm 202.

The rotating arm 202 is fixed to a side of the supporting member 201 and rotationally connected to the end of the extension arm 10.

In at least one exemplary embodiment, the supporting unit 20 is rotatable relative to the end of the extension arm 10 between a first position (as shown in FIG. 2) and a second position (as shown in FIGS. 3-4).

When the supporting unit 20 is rotated to the first position, the rotating arm 202 is parallel to the extension arm 10, and when the supporting unit 20 is rotated to the second position, the rotating arm 202 is perpendicular to the extension arm 10.

The rotating arm 202 defines a pivot hole 2201. The supporting apparatus 100 further includes a pivot pin 90 fixed to the end of the extension arm 10. The rotating arm 202 is rotationally connected to the end of the extension arm 10 through the pivot hole 2201 and the pivot pin 90.

The supporting apparatus 100 can further include an adjusting unit 30. The adjusting unit 30 is movably mounted to the supporting member 201.

When the extension arm 10 extends out of the server rack 200 and the supporting unit 20 resists against a supporting surface, the adjusting unit 20 is driven by the supporting member 201 to resist against the supporting surface, and the adjusting unit 30 is movable relative to the supporting member 201 to adjust a distance between the extension arm 10 and the supporting surface.

For example, the supporting member 201 defines a threaded hole 2110, and the adjusting unit 30 is a screw installed to the threaded hole 2110.

The extension arm 10 includes a first latching portion 130, the supporting apparatus further includes a first latching member 80 corresponding to the first latching portion 130.

When the supporting unit 20 rotates relative to the end of the extension arm 10 to the second position, the first latching portion 130 resists against the first latching member 80.

The supporting apparatus 100 can further include a latching unit 40.

The latching unit 40 can include an elastic sheet 410 and a protrusion 420.

The elastic sheet 410 is accommodated in the extension arm 10, and the protrusion 420 is connected to an end of the elastic sheet 410.

When the extension arm 10 moves to the deployed position, the extension arm 10 extends out of the server rack 200 and the protrusion 420 protrudes out of the extension arm 10 under spring force of the elastic sheet 410. The protrusion 420 resists against the server rack 200 and keeps the extension arm 10 at the deployed position. For example, the extension arm 10 defines a first installation slot 110, the elastic sheet 410 is accommodated in the first installation slot 110, and the protrusion 420 protrudes out of first installation slot 110. In another embodiment, the latching unit 40 further includes a resisting portion 430 extending toward the supporting unit 20 from the elastic sheet 410. The extension arm 10 includes a blocking portion 112 in the first installation slot 110. The blocking portion 112 is positioned below the resisting portion 430 and prevents the resisting portion 430 falling out of the first installation slot 110.

The supporting apparatus 100 can further include a second latching portion 2102 fixed on the server rack 200 corresponding to the protrusion 420.

When the extension arm 10 extends out of the server rack 200 and the protrusion 420 protrudes out of the extension arm 10 under spring force of the elastic sheet 410, the protrusion 420 resists against the second latching portion 2102.

The extension arm 10 can further define a second installation slot 120. The supporting apparatus 100 can further include a second latching member 70. The second latching member 70 is installed to the second installation slot 120, and when the extension arm 10 is moved to the deployed position, the second latching member 70 latches with the server rack 200 to prevent the extension arm 10 from separating from the server rack 200.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A supporting apparatus for supporting a server rack, comprising:
an extension arm comprising two opposite ends, wherein one end of the extension arm is movably connected to a lower side of the server rack; and
a supporting unit connected to the other end of the extension arm;
wherein the extension arm is movable between a retracted position, where the extension arm is accommodated in the lower side of the server rack, and a deployed position, where the extension arm extends out of the server rack and contacts surface of the floor through the supporting unit;
wherein the supporting apparatus further comprises a latching unit comprising:
an elastic sheet accommodated in the extension arm; and
a protrusion protruding from the elastic sheet;
a resisting portion extending toward the supporting unit from the elastic sheet;
wherein the extension arm defines a first installation slot and comprises a blocking portion in the first installation slot, the elastic sheet is accommodated in the first installation slot, the blocking portion is positioned below the resisting portion and configured to prevent the resisting portion falling out of the first installation slot, when the extension arm moves to the deployed position, the extension arm extends out of the server rack and the protrusion protrudes out of the first installation slot under force of the elastic sheet, the protrusion resists against the server rack and keeps the extension arm at the deployed position.

2. The supporting apparatus of claim 1, wherein the supporting unit is rotationally connected to the other end of the extension arm, and the supporting unit rotates relative to the other end of the extension arm to adjust a distance between the extension arm and the floor.

3. The supporting apparatus of claim 2, wherein the supporting unit comprises:
a supporting member; and
a rotating arm fixed to a side of the supporting member and rotationally connected to the other end of the extension arm.

4. The supporting apparatus of claim 3, wherein the supporting unit is rotatable relative to the other end of the extension arm between:
a first position, where the rotating arm is parallel to the extension arm, and
a second position, where the rotating arm is perpendicular to the extension arm.

5. The supporting apparatus of claim 4, wherein the rotating arm defines a pivot hole; the supporting apparatus further comprises a pivot pin fixed to the other end of the extension arm; the rotating arm is rotationally connected to the other end of the extension arm through the pivot hole and the pivot pin.

6. The supporting apparatus of claim 4, wherein the supporting apparatus further comprises a adjusting unit movably mounted to the supporting member; when the extension arm extends out of the server rack and the supporting unit resists against the floor, the adjusting unit is driven by the supporting member to resist against the floor, and the adjusting unit is movable relative to the supporting member to adjust a distance between the extension arm and the floor.

7. The supporting apparatus of claim 6, wherein the supporting member defines a threaded hole, and the adjusting unit is a screw installed to the threaded hole.

8. The supporting apparatus of claim 4, wherein the extension arm comprises a first latching portion; the supporting apparatus further comprises a first latching member corresponding to the first latching portion;

when the supporting unit rotates relative to the other end of the extension arm to the second position, the first latching portion resists against the first latching member.

9. The supporting apparatus of claim 1, wherein the supporting apparatus further comprises a second latching portion fixed on the server rack corresponding to the protrusion;
when the extension arm extends out of the server rack and the protrusion protrudes out of the extension arm under pretension force of the elastic sheet, the protrusion resists against the second latching portion.

10. A server cabinet comprising:
a server rack; and
a supporting apparatus for supporting the server rack, comprising:
an extension arm comprising two opposite ends, wherein one end of the extension arm is movably connected to a lower side of the server rack; and
a supporting unit connected to the other end of the extension arm;
wherein the extension arm is movable between a retracted position, where the extension arm is accommodated in the lower side of the server rack, and a deployed position, where the extension arm extends out of the server rack and resists against a supporting surface through the supporting unit;
wherein the supporting apparatus further comprises a latching unit comprising:
an elastic sheet accommodated in the extension arm; and
a protrusion protruding from the elastic sheet;
a resisting portion extending toward the supporting unit from the elastic sheet;
wherein the extension arm defines a first installation slot and comprises a blocking portion in the installation slot, the elastic sheet is accommodated in the first installation slot, the blocking portion is positioned below the resisting portion and configured to prevent the resisting portion falling out of the first installation slot, when the extension arm moves to the deployed position, the extension arm extends out of the server rack and the protrusion protrudes out of the first installation slot under force of the elastic sheet, the protrusion resists against the server rack and keeps the extension arm at the deployed position.

11. The server cabinet of claim 10, wherein the supporting unit is rotationally connected to the other end of the extension arm, and the supporting unit rotates relative to the other end of the extension arm to adjust a distance between the extension arm and a supporting surface.

12. The server cabinet of claim 11, wherein the supporting unit comprises:
a supporting member; and
a rotating arm fixed to a side of the supporting member and rotationally connected to the other end of the extension arm.

13. The server cabinet of claim 12, wherein the supporting unit is rotatable relative to the other end of the extension arm between a first position, where the rotating arm is parallel to the extension arm, and a second position, where the rotating arm is perpendicular to the extension arm.

14. The server cabinet of claim 13, wherein the rotating arm defines a pivot hole; the supporting apparatus further comprises a pivot pin fixed to the other end of the extension arm; the rotating arm is rotationally connected to the other end of the extension arm through the pivot hole and the pivot pin.

15. The server cabinet of claim 13, wherein the supporting apparatus further comprises a adjusting unit movably mounted to the supporting member; when the extension arm extends out of the server rack and the supporting unit resists against a supporting surface, the adjusting unit is driven by the supporting member to resist against the supporting surface, and the adjusting unit is movable relative to the supporting member to adjust a distance between the extension arm and the supporting surface.

16. The server cabinet of claim 15, wherein the supporting member defines a threaded hole, and the adjusting unit is a screw installed to the threaded hole.

17. The server cabinet of claim 13, wherein the extension arm comprises a first latching portion; the supporting apparatus further comprises a first latching member corresponding to the first latching portion;
when the supporting unit rotates relative to the other end of the extension arm to the second position, the first latching portion resists against the first latching member.

18. The server cabinet of claim 10, wherein the supporting apparatus further comprises a second latching portion fixed on the server rack corresponding to the protrusion;
when the extension arm extends out of the server rack and the protrusion protrudes out of the extension arm under pretension force of the elastic sheet, the protrusion resists against the second latching portion.

* * * * *